United States Patent
Jung et al.

(10) Patent No.: US 7,825,438 B2
(45) Date of Patent: Nov. 2, 2010

(54) CMOS IMAGE SENSOR HAVING DRIVE TRANSISTOR WITH INCREASED GATE SURFACE AREA AND METHOD OF MANUFACTURING THE SAME

(75) Inventors: Jong-wan Jung, Gyeonggi-do (KR); Duck-hyung Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 892 days.

(21) Appl. No.: 11/463,317

(22) Filed: Aug. 9, 2006

(65) Prior Publication Data
US 2007/0034965 A1 Feb. 15, 2007

(30) Foreign Application Priority Data
Aug. 9, 2005 (KR) ............. 10-2005-0072997

(51) Int. Cl.
*H01L 27/146* (2006.01)
(52) U.S. Cl. .......... 257/233; 257/292; 257/443; 257/E27.133; 257/E21.429; 438/73; 438/589; 438/964
(58) Field of Classification Search ........... 257/233, 257/292, 444, 443, E27.133, E21.429; 438/66, 438/73, 60, 75, 589, 964
See application file for complete search history.

(56) References Cited

U.S. PATENT DOCUMENTS

| | | | | |
|---|---|---|---|---|
| 5,275,960 | A * | 1/1994 | Yamaguchi et al. | 438/287 |
| 5,504,022 | A * | 4/1996 | Nakanishi et al. | 438/594 |
| 5,879,978 | A | 3/1999 | Ra | |
| 7,105,892 | B2 * | 9/2006 | Shimada | 257/338 |
| 2004/0217396 | A1 | 11/2004 | Lee | |
| 2004/0222464 | A1 * | 11/2004 | Shimada | 257/347 |
| 2006/0180745 | A1 * | 8/2006 | Lee | 250/214.1 |
| 2006/0192250 | A1 * | 8/2006 | Lee | 257/338 |
| 2006/0273344 | A1 * | 12/2006 | Lee et al. | 257/137 |
| 2006/0284273 | A1 * | 12/2006 | Ho et al. | 257/428 |
| 2007/0057313 | A1 * | 3/2007 | Kim | 257/315 |

FOREIGN PATENT DOCUMENTS

| | | |
|---|---|---|
| JP | 7131009 | 5/1995 |
| JP | 2004-288822 | 10/2004 |
| KR | 1020020045165 A | 8/2000 |
| KR | 1020020045165 A | 6/2002 |
| KR | 1020050014078 A | 7/2003 |

OTHER PUBLICATIONS

First Office Action, Chinese Patent Application No. 200610151336.3, Apr. 10, 2009.

* cited by examiner

*Primary Examiner*—Mary Wilczewski
*Assistant Examiner*—Toniae M Thomas
(74) *Attorney, Agent, or Firm*—Myers Bigel Sibley & Sajovec

(57) ABSTRACT

A CMOS image sensor cell includes a semiconductor active region of first conductivity type having a surface thereon and a P-N junction photodiode in the active region. A drive transistor is also provided in the semiconductor active region. The drive transistor has a gate electrode that is configured to receive charge generated in the P-N junction photodiode during an image capture operation (i.e., during capture of photons received from an image). This drive transistor has a gate electrode and a contoured channel region extending underneath the gate electrode. The contoured channel region has an effective channel length greater than a length of the gate electrode.

13 Claims, 9 Drawing Sheets

CMOS IMAGE SENSOR HAVING DRIVE TRANSISTOR WITH INCREASED GATE SURFACE AREA AND METHOD OF MANUFACTURING THE SAME

REFERENCE TO PRIORITY APPLICATION

This application claims the benefit of Korean Patent Application No. 10-2005-0072997, filed on Aug. 9, 2005, in the Korean Intellectual Property Office, the disclosure of which is hereby incorporated herein by reference.

FIELD OF THE INVENTION

The present invention relates to integrated circuits and integrated circuit fabrication methods, and more particularly, to CMOS image sensors and methods of manufacturing CMOS image sensors.

BACKGROUND OF THE INVENTION

CMOS image sensors can be easily manufactured at a low cost as compared with Charge Coupled Devices (CCDs), and thus are among the most commonly used image pickup devices. Also, because a unit pixel of a CMOS image sensor is formed of MOS transistors, a CMOS image sensor can be embodied within a narrower area than that of a CCD thereby providing higher resolution. Furthermore, signal processing logic can be formed in an image circuit where the pixels are formed, and the image circuit and the signal processing circuit can be integrated into a single circuit.

Such CMOS image sensors are formed of a plurality of unit pixels to achieve high resolution. Each unit pixel includes a photodiode for sensing images, and transistors (e.g., a transfer transistor, a reset transistor, and a drive transistor (or source follower)), to transfer a signal sensed by the photodiode to a signal processing circuit. CMOS image sensors can be used in diverse mobile electronic products such as cellular phones, Personal Digital Assistants (PDAs), and digital cameras. Since devices such as PDAs and cellular phones are being reduced in size, a demand for higher integration of the CMOS image sensors is increasing. Since a unit pixel size has to be reduced in order to achieve higher integration of a CMOS image sensor, areas of the photodiode and the transistors constituting the unit pixel are being gradually decreased.

However, if a transistor area is decreased as stated above, a flicker noise phenomenon can occur on a screen that outputs a captured image. It is known that flicker noise occurs due to partially trapped charge on an interfacial surface of a substrate (silicon) and a gate oxide layer when passing through a channel region of the transistor. In particular, experiments have confirmed that flicker noise becomes further sensitive to a decrease in an area of a gate insulating layer (i.e., a channel length), and is most affected by a gate insulating layer area of a source follower SF (i.e., a drive transistor that amplifies charge stored in a floating diffusion region FD to form a signal).

To solve these problems, a method of increasing a gate area of the drive transistor has been suggested. However, if the gate area of the drive transistor is increased, a fill factor is decreased, which may degrade a picture quality characteristic of the CMOS image sensor. Therefore, a method of increasing an area of a gate insulating layer of a drive transistor within a range that does not reduce the fill factor is required.

SUMMARY OF THE INVENTION

Integrated circuit devices according to embodiments of the present invention include a CMOS image sensor having reduced flicker noise characteristics. These sensors include a plurality of CMOS image sensor cells (i.e., unit cells of a CMOS image sensor array). These cells are formed in a substrate (e.g., semiconductor substrate) having a semiconductor active region of first conductivity type therein extending adjacent a surface thereof. Each of a plurality of cells includes a corresponding P-N junction photodiode and a drive transistor, which extend in the semiconductor active region. The drive transistor has a gate electrode that is configured to receive charge generated in the P-N junction photodiode during an image capture operation (i.e., during capture of photons received from an image). This drive transistor has a gate electrode and a contoured channel region extending underneath the gate electrode. The contoured channel region has an effective channel length greater than a length of the gate electrode.

According to some of these embodiments, the contoured channel region extends across a portion of a surface of the active region having a plurality of peaks and valleys therein extending opposite the gate electrode. These peaks and valleys cause the surface of the active region to be rippled (i.e., have a plurality of undulations along the surface). According to other ones of these embodiments, the contoured channel region extends along a sidewall and bottom of a trench formed in the active region and the gate electrode extends into the trench. According to still further embodiments of the invention, the gate electrode of the drive transistor is directly electrically connected to a cathode terminal of the P-N junction photodiode and a transfer transistor is omitted. In this embodiment, a reset transistor is provided having a source/drain region directly electrically coupled to the cathode terminal.

Still further embodiments of the present invention include methods of forming CMOS image sensor unit cells. These methods include forming a recess in a surface of a semiconductor active region of first conductivity type and lining the recess with a gate insulating layer. A gate electrode of a drive transistor is formed on the lined recess. In addition, a P-N junction photodiode is formed in the active region. According to some of these method embodiments, the step of forming a recess includes forming a plurality of recesses located side-by-side in the surface of the semiconductor active region. These recesses may be sufficiently close so that the surface of the substrate has a rippled (i.e., undulating) surface profile. The step of forming the gate electrode may also include forming a gate electrode of a drive transistor opposite the plurality of recesses. In other embodiments, the step of forming a recess includes forming first and second pluralities of recesses located side-by-side in the surface of the semiconductor active region. In this case, the step of forming a gate electrode includes forming a gate electrode of a drive transistor opposite the first plurality of recesses and forming a gate electrode of a reset transistor opposite the second plurality of recesses.

According to another embodiment of the present invention, there is provided a CMOS image sensor including a semiconductor substrate having a contoured active region therein. A reset gate, a drive gate, and a select gate, which are spaced apart from one another by a predetermined interval, are formed on predetermined portions of the active region. Gate insulating layers are respectively interposed between the gates and the active region, and a photodiode is formed in a predetermined portion of the active region, on one side of the reset gate. Junction regions are disposed on both sides of the reset gate, both sides of the drive gate, and both sides of the select gate. Also, a transfer gate is disposed on the active region between the reset gate and the photodiode, and a floating diffusion region is formed between the transfer gate and the reset gate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
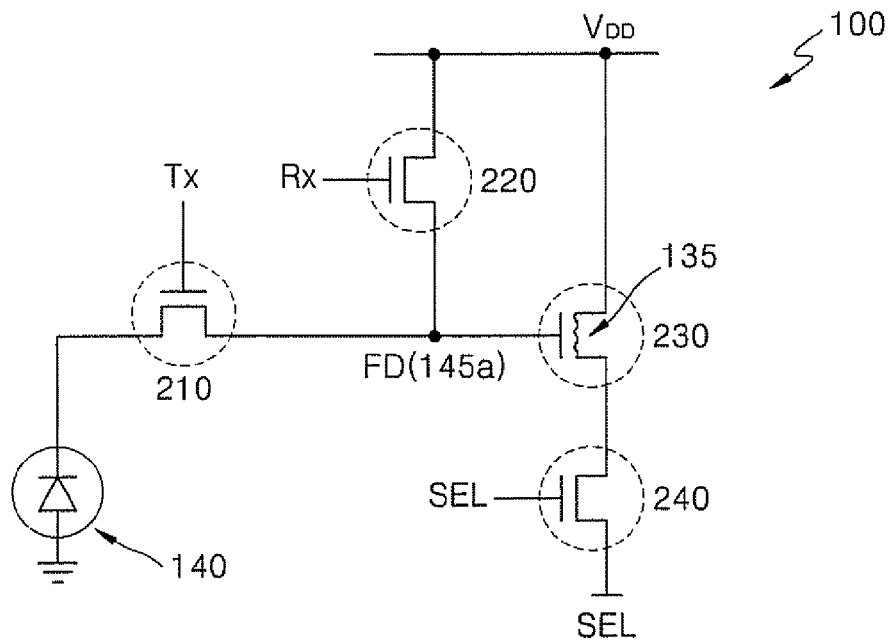
FIG. 1 is a circuit diagram schematically illustrating a unit pixel of a CMOS image sensor having four transistors according to an embodiment of the present invention.

The present invention will now be described more fully with reference to the accompanying drawings, in which exemplary embodiments of the invention are shown. The invention may, however, be embodied in many different forms and should not be constructed as being limited to the embodiments set forth herein; rather, these embodiments are provided so that this disclosure will be thorough and complete, and will fully convey the concept of the invention to those skilled in the art. The present invention is just defined by the scope of the claims. Like reference numerals in this description denote like elements.

According to the present invention, a channel region having a contoured surface profile will be formed under a gate of a drive transistor that amplifies charge picked up by a photodiode to convert the light image to charges. By doing so, an area of a gate insulating layer overlapping the drive transistor gate is substantially increased, so that the drive transistor gate is less sensitive to variation of an output voltage when electrons are trapped in an interfacial surface of the gate insulating layer and a substrate. Therefore, the variation of the output voltage is decreased to thus reduce noise such as flicker. A CMOS image sensor characterized as above will be described hereinafter in more detail.

FIG. 1 is a circuit diagram schematically illustrating a unit pixel 100 of a CMOS image sensor having four transistors according to an embodiment of the present invention. Referring to FIG. 1, the unit pixel 100 of the CMOS image sensor includes a photodiode 140, a transfer transistor 210 for transferring charge picked up by the photodiode 140, and a floating diffusion region (FD) 145a for storing the charge transferred by the transfer transistor 210. Additionally, a reset transistor 220 periodically resets the floating diffusion region (FD) 145a. A drive transistor 230, acting as a source follower, amplifies the charge stored in the floating diffusion region 145a, and a select transistor 240 provides an output signal of the drive transistor 230 in accordance with a unit pixel selection signal SEL. The drive transistor 230 is designed to have a contoured channel region 135. Here, Tx denotes a transfer gate signal, and Rx denotes a reset gate signal.

Figure 2:
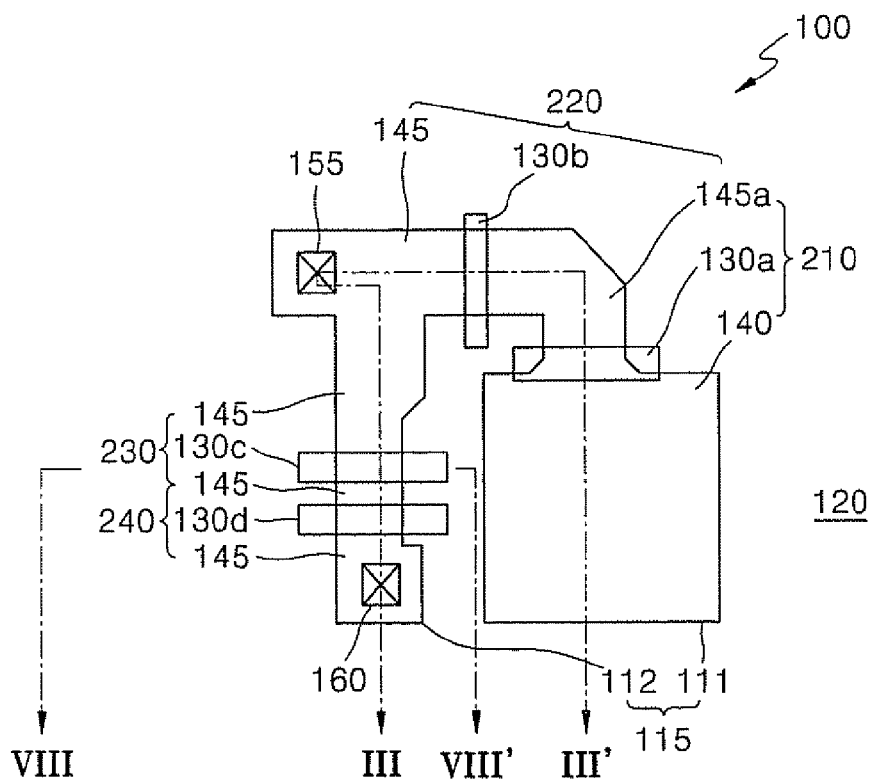
FIG. 2 is a plan view illustrating the unit pixel of the CMOS image sensor of FIG. 1 according to an embodiment of the present invention.
Figure 3:
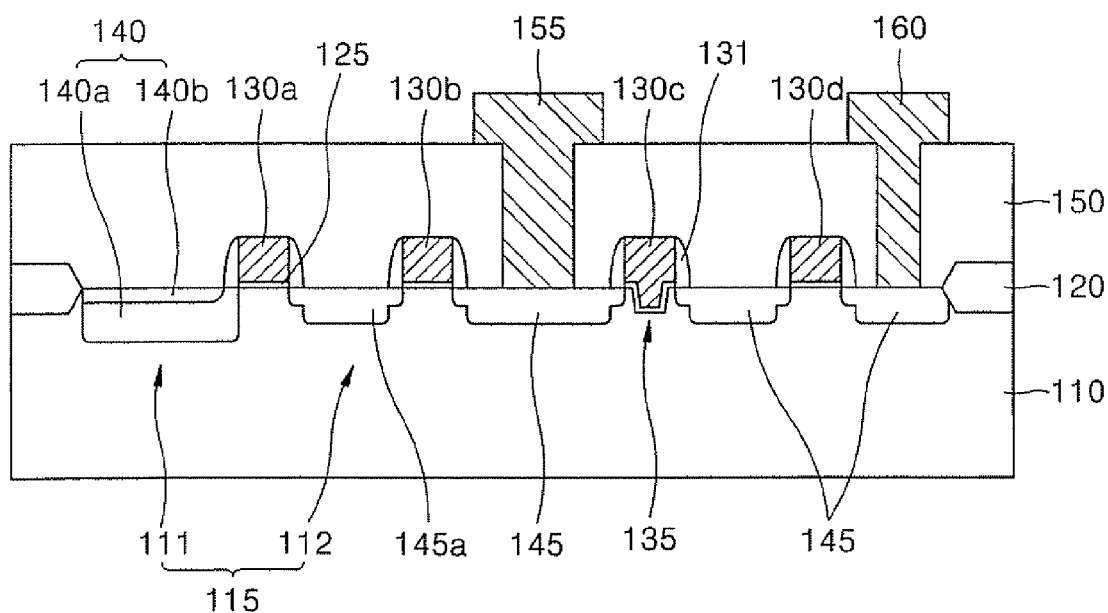
FIG. 3 is a sectional view of the CMOS image sensor of FIG. 1 taken along a line III-III' of FIG. 2.

FIG. 2 is a plan view illustrating the unit pixel of the CMOS image sensor of FIG. 1 according to an embodiment of the present invention and FIG. 3 is a sectional view of the CMOS image sensor of FIG. 1 taken along a line III-III' of FIG. 2. Referring to FIGS. 2 and 3, the unit pixel 100, constructed as above, is integrated on an active region 115 formed on a semiconductor substrate 110. The active region 115 is defined by forming a device isolating layer 120 on the semiconductor substrate 110. The active region 115 may be partitioned into a first active region 111 to be formed with the photodiode 140 therein, and a second active region 112 that extends from a predetermined portion of the first active region 111 and is to be formed with transistors thereon. The first active region 111 may be formed to occupy most of the area of the unit pixel 100 to increase a fill factor, and may have a rectangular shape. The second active region 112 may have a line pattern with a predetermined width as extending from the predetermined portion of the first active region 111. The second active region 112 may be bent to be effectively disposed in a narrow space of the unit pixel 100.

In order to form the respective transistors 210, 220, 230, and 240, gates 130a, 130b, 130c, and 130d of the transistors 210, 220, 230, and 240, respectively, are disposed on predetermined portions of the active region 115. First, a transfer gate 130a of the transfer transistor 210 is disposed on a border of the first active region 111 and the second active region 112 of the active region 115, and a reset gate 130b, a drive gate 130c, and a select gate 130d spaced apart from one another by predetermined intervals are disposed on the second active region 112 of the active region 115. Gate insulating layers 125 are interposed between the active region 115 and the gates 130a, 130b, 130c, and 130d, respectively. Also, spacers 131 may be formed on sidewalls of the gates 130a, 130b, 130c, and 130d.

In this case, an uneven channel 135 is formed in the active region 115 where the drive gate 130c, acting as the source follower, is formed. The channel 135 provided to a lower surface of the drive gate 130c substantially increases an area of the drive gate 130c overlapping the gate insulating layer 125, thereby decreasing the sensitivity of an output voltage of the drive transistor 230 with respect to electrons trapped in an interfacial surface of the gate insulating layer 125 and the semiconductor substrate 110. That is, when an area of the drive gate 130c is decreased by considering a fill factor, an effective area (an area of the gate insulating layer overlapping the drive gate) of the gate insulating layer 125 is also decreased. Accordingly, if electrons migrating from a drain to a source are partially trapped in the interfacial surface of the gate insulating layer 125 and the semiconductor substrate 110, the output voltage varies greatly, which in turn produces flicker noise. However, when the contoured channel 135 is formed on the bottom portion of the drive gate 130c, the area of the drive gate 130c overlapping the gate insulating layer 125 is increased by the channel 135 even though the drive gate 130c is designed to be sufficiently narrow by considering the fill factor. Therefore, even if the electrons supplied from a drain (i.e., a $V_{DD}$ contact 155), are partially trapped in the interfacial surface between the gate insulating layer 125 and the semiconductor substrate 110, the effective area of the gate insulating layer 125 is relatively increased. Thus, variation Δn of the number of electrons (i.e., variation of current), becomes less sensitive. Consequently, the output voltage variation of the drive transistor 230 is decreased.

An n-type impurity region 140a and a p-type impurity region 140b are formed in the first active region 111 on a first side of the transfer gate 130a, thereby forming a photodiode 140. The p-type impurity region 140b, which is formed in a surface of the n-type impurity region 140a, acts to eliminate a dark source.

A floating diffusion region 145a and junction regions 145 composed of the n-type impurity are formed on a second side of the transfer gate 130a, both sides of the reset gate 140b, both sides of the drive gate 130c, and both sides of the select gate 130d. In this case, the respective gates 130a, 130b, 130c, and 130d are formed to share the junction regions 145. The junction regions 145 may be formed using Lightly Doped Drain (LDD) formation techniques. By forming such junction regions 145, the transfer transistor 210, the reset transistor 220, the drive transistor 230, and the select transistor 240 are formed.

The $V_{DD}$ contact 155 is formed on the junction region 145 of the reset transistor 220 (e.g., the junction region 145 between the reset gate 130b and the drive gate 130c), and an output contact 160 is formed on the junction region 145 on one side of the select gate 130d. A reference numeral 150 denotes an interlayer insulating layer. Also, a P-well may be formed in the active region 115 by considering the characteristics of the transistors 210, 220, 230, and 240.

Figure 4A:
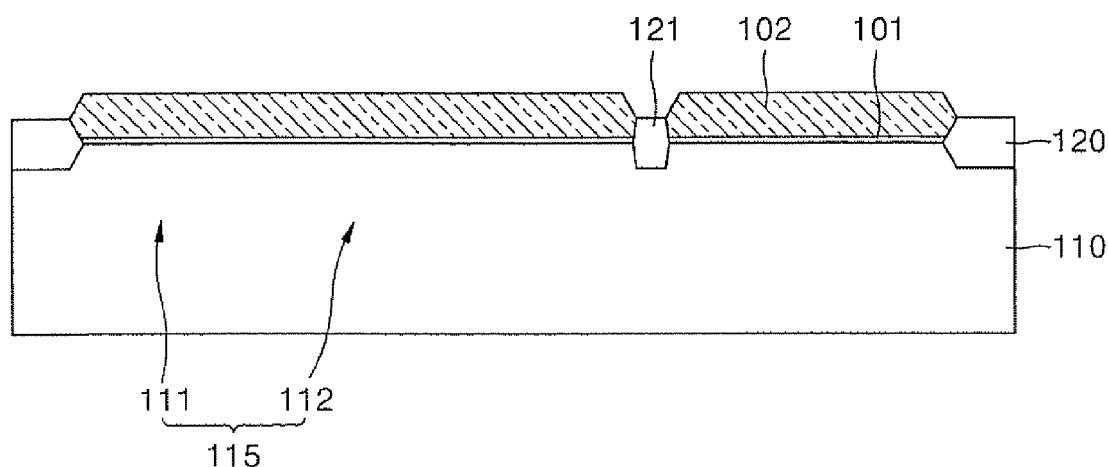
FIGS. 4A through 4C are sectional views illustrating a method of manufacturing a CMOS image sensor having a drive transistor with a contoured channel region according to an embodiment of the present invention.
Figure 4B:
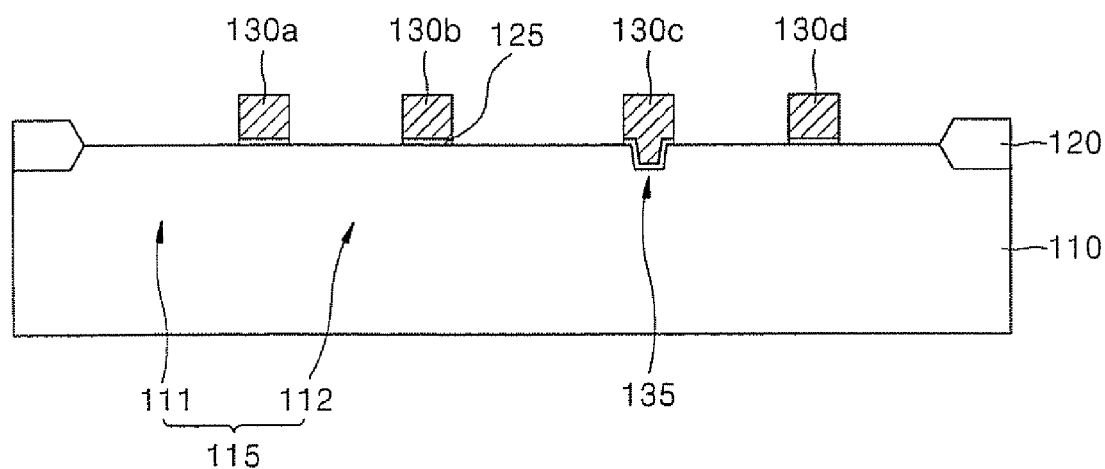
Figure 4C:
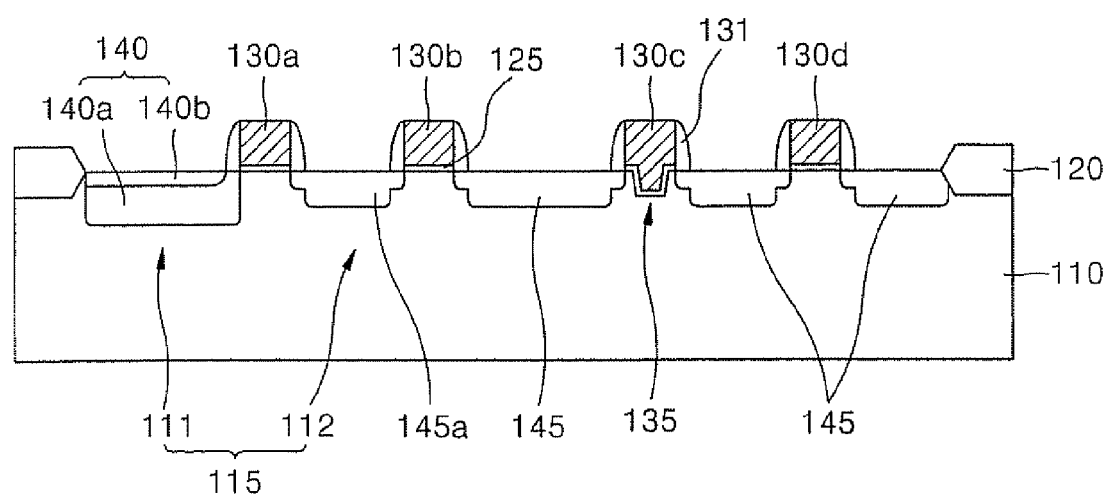
Figure 5:
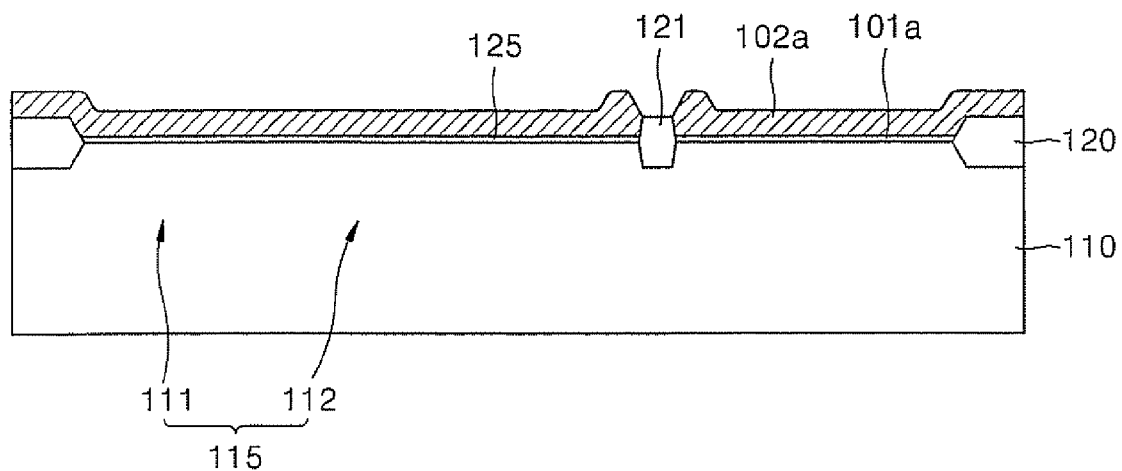
FIG. 5 is a sectional view for illustrating a method of manufacturing a CMOS image sensor according to another embodiment of the present invention.

FIGS. 4A through 4C are sectional views illustrating a method of manufacturing a CMOS image sensor having a contoured channel region according to an embodiment of the present invention. Referring to FIG. 4A, a pad oxide layer 101 and a silicon nitride layer 102 are sequentially deposited on a semiconductor substrate 110. Then, the silicon nitride layer 102 is etched to expose a pre-isolation region and a presumed drive gate region. Thereafter, the pre-isolation region and the presumed drive gate region are oxidized to form a Local Oxidation Silicon (LOCOS)-type isolating layer 120, a local oxide layer 121, respectively, thereby defining a first active region 111 and a second active region 112. Alternatively, referring to FIG. 5, the isolating layer 120 is formed using a LOCOS or Shallow Trench Isolation (STI) method, and a pad oxide layer 101a and a silicon nitride layer 102a are formed on the semiconductor substrate 110. Subsequently, the silicon nitride layer 102a is etched to expose the presumed drive gate region, and the exposed presumed drive gate region may be locally oxidized to form a local oxide layer 121.

Referring to FIG. 4B, the local oxide layer 121 is selectively removed. The local oxide layer 121 may be selectively removed by wet etching the local oxide layer 121 under a state of shielding the isolating layer 120 with a predetermined layer (not shown). By doing so, a predetermined indented portion (i.e., recess) is formed in an active region 115 where the local oxide layer 121 is removed. A gate insulating layer 125 and a conductive layer for a gate electrode (e.g., a doped polysilicon layer), are sequentially stacked on an upper surface of the semiconductor substrate 110 having the indented portion in the active region 115. Predetermined portions of the doped polysilicon layer and the gate insulating layer 125 are etched to form a transfer gate 130a, a reset gate 130b, a drive gate 130c, and a select gate 130d. In this case, the drive gate 130c is disposed on the indented (i.e., recessed) portion. Therefore, a recessed-type channel region 135 is provided on the bottom surface of the drive gate 130c to increase an overlap area of the drive gate 130c and the gate insulating layer 125 without changing a linewidth of the drive gate 130c. This recessed-type channel region is also referred to herein as a contoured channel region. A p-well (not shown) may be formed in the active region 115 by considering characteristics of the transistor between the forming of the recess and the forming of the gates 130a through 130d.

Referring to FIG. 4C, a photoresist pattern (not shown) is formed to expose the first active region 111. Ah n-type impurity 140a is implanted into the first active region 111 to form an n-type impurity region 140a. Then, a p-type impurity is implanted into a surface of the n-type impurity region 140a to form a p-type impurity region 140b, thereby forming a photodiode 140. The n-type impurity may be phosphor (P) ions, and the p-type impurity may be boron (B) ions. These impurities are tilt implanted at a predetermined acute angle (or a predetermined obtuse angle) with respect to the semiconductor substrate 110. After removing the photoresist pattern for forming the photodiode 140, a photoresist pattern is formed once more to expose the second active region 112. Subsequently, the n-type impurity is implanted into the exposed second active region 112 to form junction regions 145 between the floating diffusion region 145a and the reset transistor 220, and between the drive transistor 230 and the select transistor 240. When the junction region 145 is of an LDD type, as is well known in the art, a low density n-type impurity is implanted into the exposed second active region 112. Then, gate spacers 131 are formed on sidewalls of the respective gates 130a through 130d using a well-known method, and the high density n-type impurity is formed in the exposed second active region 112. The photoresist pattern that opens the second active region 112 is then removed.

Referring to FIG. 3, the interlayer insulating layer 150 is formed on an upper surface of the semiconductor substrate 110 where the transistors 210, 220, 230, and 240 are formed. The predetermined portions of the interlayer insulating layer 150 are etched to expose the junction regions 145 of the reset transistor 220 (e.g., the drain region), and the junction region 145 of the select transistor 240 (e.g., the source region), thereby forming the contact holes. A conductive material is filled into the contact holes to form the $V_{DD}$ contact 155 and the output contact 160.

Figure 6A:
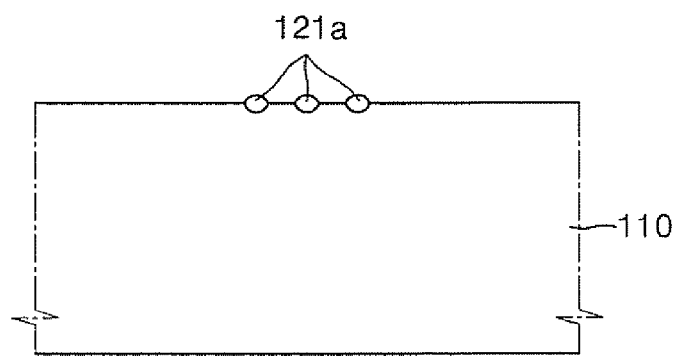
FIGS. 6A and 6B are sectional views of a drive transistor having a contoured channel region according to another embodiment of the present invention.
Figure 6B:
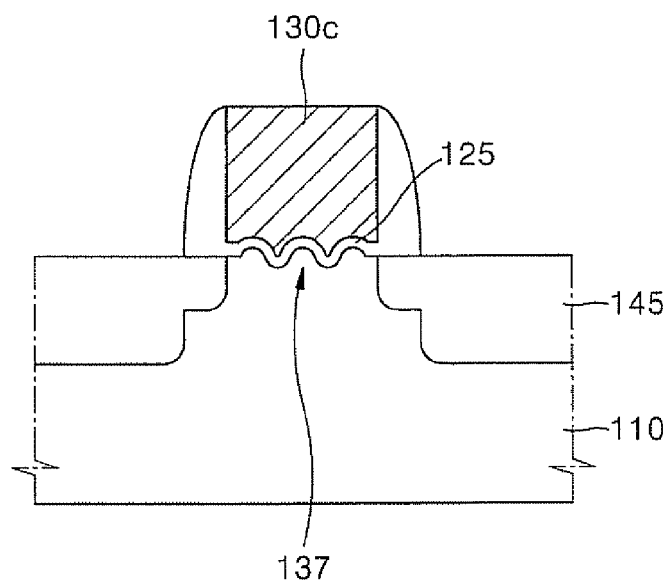

According to the present embodiment, the single recess is formed in the bottom portion of the drive gate 130c, but a contoured channel region 137 with a plurality of side-by-side recesses may be provided by forming a plurality of local oxide layers 121a on a presumed drive gate region as illustrated in FIGS. 6A and 6B. FIGS. 6A and 6B are sectional views of a drive transistor having a contoured channel region with an undulating surface profile according to another embodiment of the present invention. Also, in order to effectively form the plurality of local oxide layers 121a, oxygen ions may be implanted into the exposed channel region before performing the local oxidation. Furthermore, the contoured channel region 137 with the plurality of recesses may be obtained by providing an intentional morphology on the surface of the substrate using a process in which the channel regions are implanted with inert ions (e.g., Ar ions or $N_2$ ions), that does not disturb channel formation, and the resultant structure is annealed.

Figure 7A:
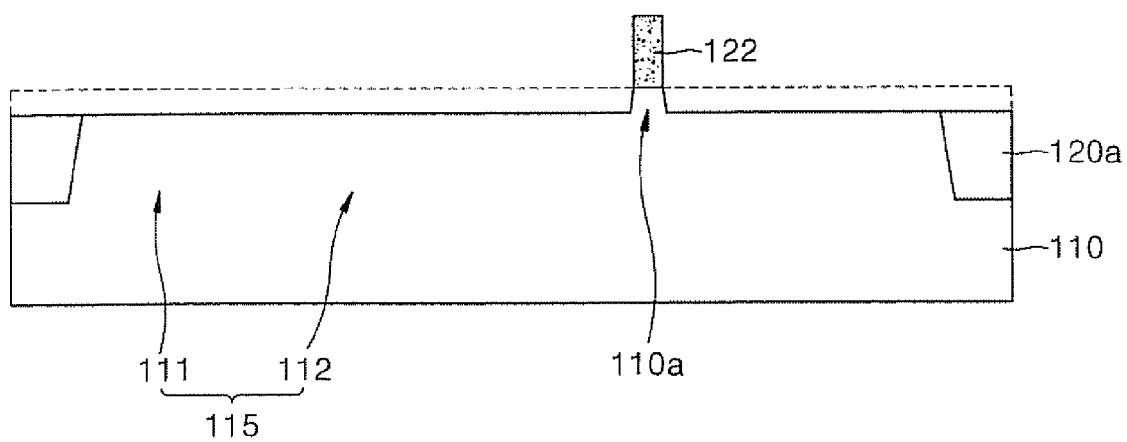
FIGS. 7A and 7B are sectional views illustrating methods of manufacturing a CMOS image sensor according to another embodiment of the present invention.
Figure 7B:
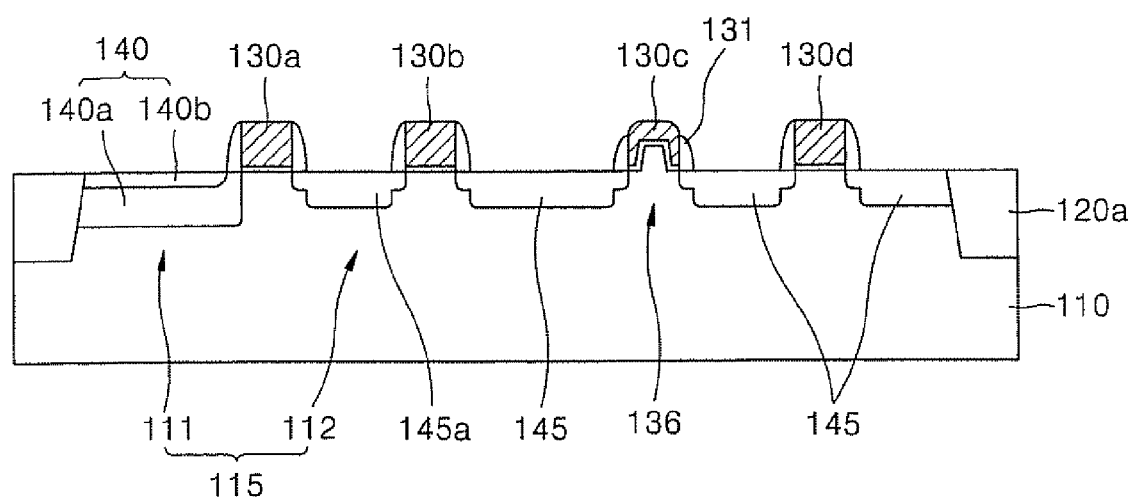

The contoured channel region 135 of the drive transistor 130 has the recess in the present embodiment, but a contoured channel region 136 may have a protrusion as illustrated in FIGS. 7A and 7B. FIGS. 7A and 7B are sectional views illustrating a method of manufacturing a CMOS image sensor having a contoured channel region according to another embodiment of the present invention. Referring to FIG. 7A, an isolating layer 120a is formed in a predetermined portion of a semiconductor substrate 110 using the well-known STI method. Then, a mask pattern 122 is formed on an upper surface of the semiconductor substrate 110 corresponding to a presumed drive gate region. The mask pattern 122 may be formed of a material (e.g., photoresist), selective respectively to silicon and silicon oxide. Using the mask pattern 122 as a mask, the semiconductor substrate 110 (i.e., the active region 115 and the isolating layer 120a), is etched to a predetermined thickness, thereby forming a projecting portion 110a on the presumed drive gate region.

Referring to FIG. 7B, as in the previous embodiments, a transfer gate 130a, a reset gate 130b, a drive gate 130c, and a select gate 130d, including gate insulating layers 125, are formed. In this case, the drive gate 130c is formed to include the protrusion 110a, so that a vertically contoured channel region 136 is formed on a lower portion of the drive gate 130c. By doing so, even though the drive gate 130c is designed to have an identical planar area with the other gates 130a, 130b, and 130d on the same plane by considering the fill factor, an area overlapping the gate insulating layer 125 is substantially increased. Therefore, the variation of the output voltage of the drive transistor 230 is reduced, and flicker can be prevented. Thereafter, the forming of a photodiode 140, a floating diffusion region 145a, a junction region 145, and contacts 155 and 160 may be carried out as in the previous embodiment.

Figure 8:
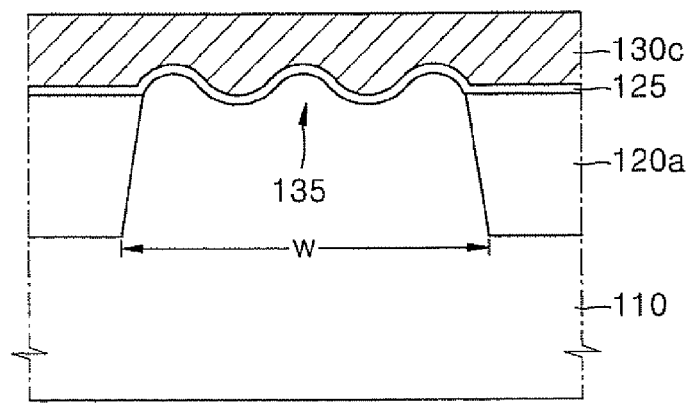
FIG. 8 is a sectional view of a drive transistor of the CMOS image sensor of FIG. 1 taken along a line VIII-VIII' of FIG. 2.

Moreover, a contoured channel 135 may be formed in the direction of a channel width (w) of the drive gate 130c as illustrated in FIG. 8 in order to increase the overlapped area of the drive gate 130c and the gate insulating layer 125.

Figure 9:
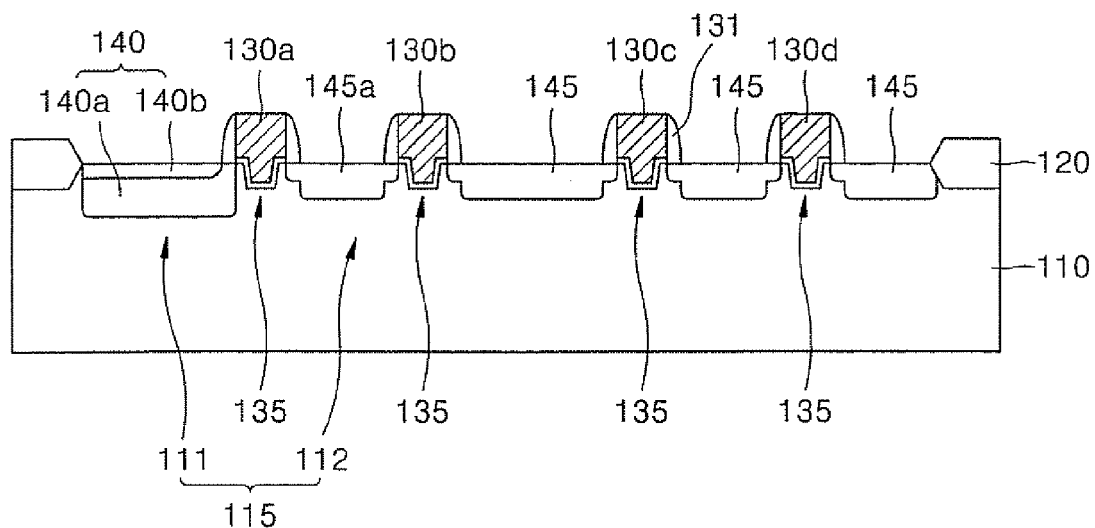
FIG. 9 is a sectional view of a CMOS image sensor according to another embodiment of the present invention.

FIG. 9 is a sectional view of a CMOS image sensor having a recessed channel formed in at least one active region according to another embodiment of the present invention. Referring to FIG. 9, a channel 135 having a recessed shape may be formed in at least one region of an active region 115 where a transfer gate 130a, a reset gate 130b, a drive gate 130c, and a select gate 130d are formed (e.g., in respective four gates). The forming of the recessed channels 135 in the lower portions of each of the gates 130a, 130b, 130c, and 130d is similar to the forming of the recess 135 in the lower portion of the drive gate 130c by forming local oxide layers on all presumed gate regions, and then removing the local oxide layers. If the recessed 135 are formed in the lower portions of each of the gates 130a, 130b, 130c, and 130d that constitute a unit pixel, the recesses 135 compensate for a channel length even though sizes of the transfer transistor, the reset transistor, and the select transistor are reduced by considering the fill factor, thereby decreasing a short channel effect. On the other hand, as described above in the case of the drive transistor 130, the area of the gate insulating layer 125 overlapping the drive gate 130c is increased to decrease the flicker noise as well as the short channel effect.

Figure 10:
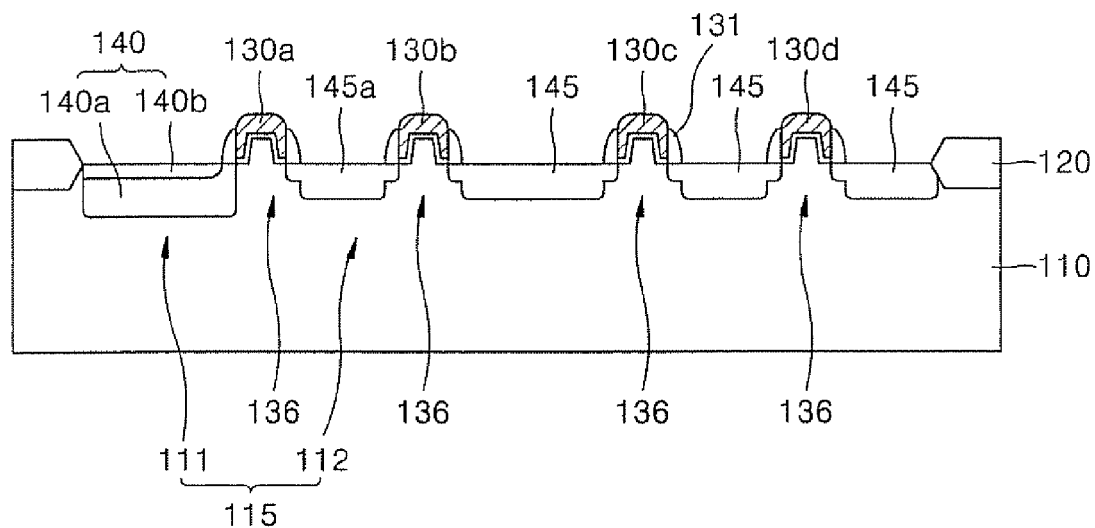
FIG. 10 is a sectional view of a CMOS image sensor according to another embodiment of the present invention.

Instead of the recess 135 (i.e., recessed channel region), a protrusion 136 (i.e., protruding channel regions) may be formed on the active region 115 where the gates 130a, 130b, 130c, and 130d are formed as illustrated in FIG. 10. FIG. 10 is a sectional view of a CMOS image sensor having a "projecting-type" contoured channel region formed on at least one active region according to another embodiment of the present invention. As described above, the projecting-type channel regions 136 are provided by etching the active region 115 exclusive of the presumed gate region and the device isolating layer 121 to a predetermined depth.

Figure 11:
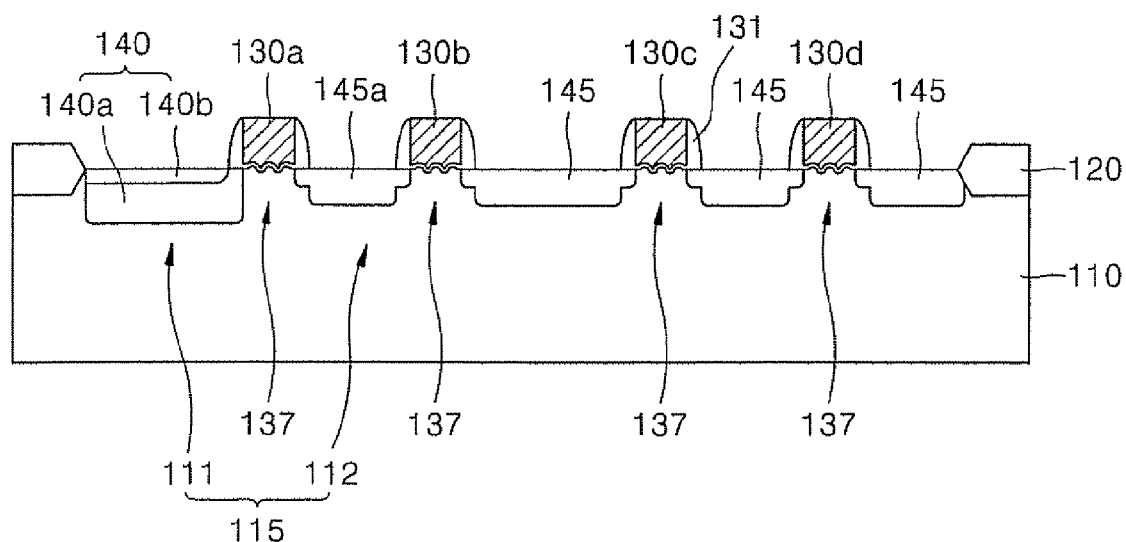
FIG. 11 is a sectional view of a CMOS image sensor having transistors therein with contoured channel regions according to other embodiments of the present invention.

FIG. 11 is a sectional view of a CMOS image sensor having contoured channel regions 137 formed in at least one active region 115 according to another embodiment of the present invention. Referring to FIG. 11, the contoured channel regions 137 may be formed in lower portions of respective gates 130a, 130b, 130c, and 130d. The regions 137 may be obtained by forming a plurality of local oxide layers on presumed gate regions, and removing the plurality of local oxide layers as described above. The contoured channel regions 137 may be obtained by implanting inert ions that do not affect the channel formation in the presumed gate region, and then annealing the resultant structure.

Figure 12:
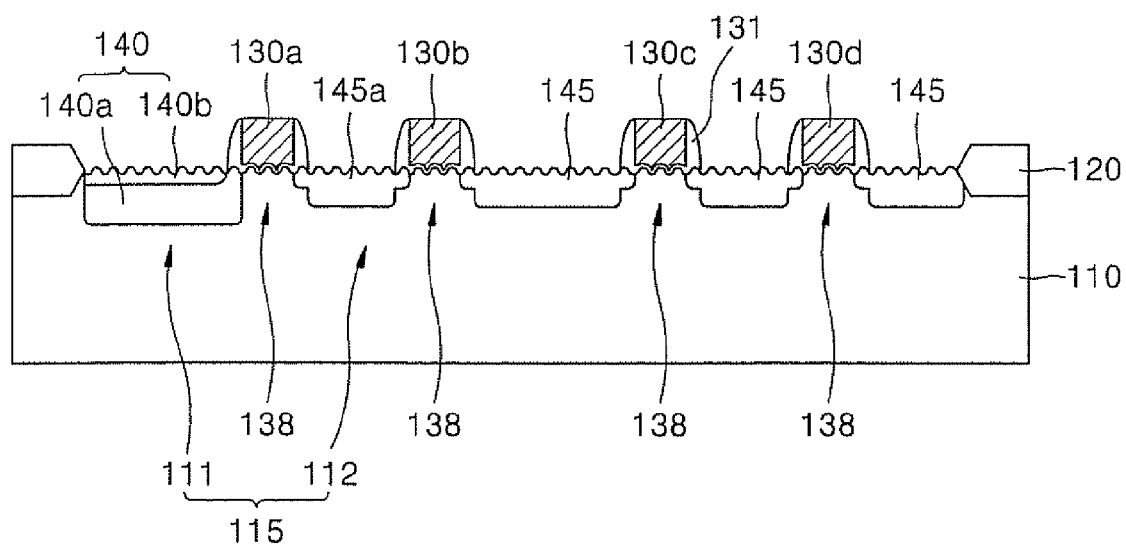
FIG. 12 is a sectional view of a CMOS image sensor according to another embodiment of the present invention.

FIG. 12 is a sectional view of a CMOS image sensor having a contoured channel 138 formed on the entire surface of an active region 115 according to another embodiment of the present invention. If the contoured channel 138 is formed on the entire surface of the active region 115, the channel 138 is formed in the lower portions of gates 130a through 130d and on respective surfaces of a photodiode 140, a floating diffusion region 145a, and junction regions 145, which constitute a unit pixel. The contoured channel 138 formed on the entire surface of the active region 115 may be obtained by selectively forming local oxide layers (not shown) on the entire surface of the active region 115, and removing the local oxide layers. Also, the whole channel 138 may be obtained such that inert ions not affecting a channel formation are ion implanted into the entire surface of the active region 115 and annealing is performed to induce morphology. Otherwise, predetermined processing is performed on the surface of the active region 115, and a hemispheric grain material is deposited, thereby obtaining the overall contoured channel 138. In this case, before depositing the hemispheric grain material, the processing of the surface of the active region 115 may be (e.g., polycrystalline processing). By forming the contours 138 on the entire surface of the active region 115, the short channel phenomenon of the transistor (i.e., transfer transistor, reset transistor and select transistor) is decreased, and the flicker noise of the drive transistor is decreased. Furthermore, when forming contacts 155 and 160 (see FIG. 3) the contact area is increased to thereby reduce contact resistance.

Figure 13:
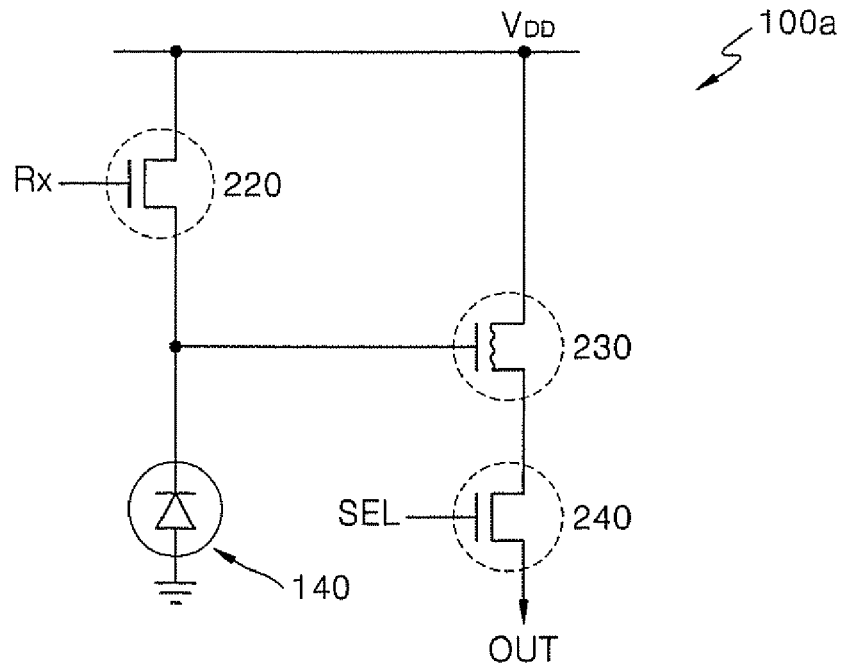
FIG. 13 is a circuit diagram illustrating a unit pixel of a CMOS image sensor having three transistors according to an embodiment of the present invention.

FIG. 13 is a circuit diagram illustrating a unit pixel 100a of a CMOS image sensor according to another embodiment of the present invention. Referring to FIG. 13, the unit pixel 100a of the CMOS image sensor may have three transistors (i.e., a reset transistor 220, a drive transistor 230, and a select transistor 240), without including a transfer transistor 210. The unit pixel 100a also has a photodiode 140. A drive transistor 230 is shown as having a contoured channel region. This drive transistor 230 amplifies charge picked up by the photodiode 140. In this case, the charge picked up by the photodiode 140 is not transferred by a transfer transistor, but is directly controlled by the reset transistor 220 and is amplified by the drive transistor 230.

Figure 14:
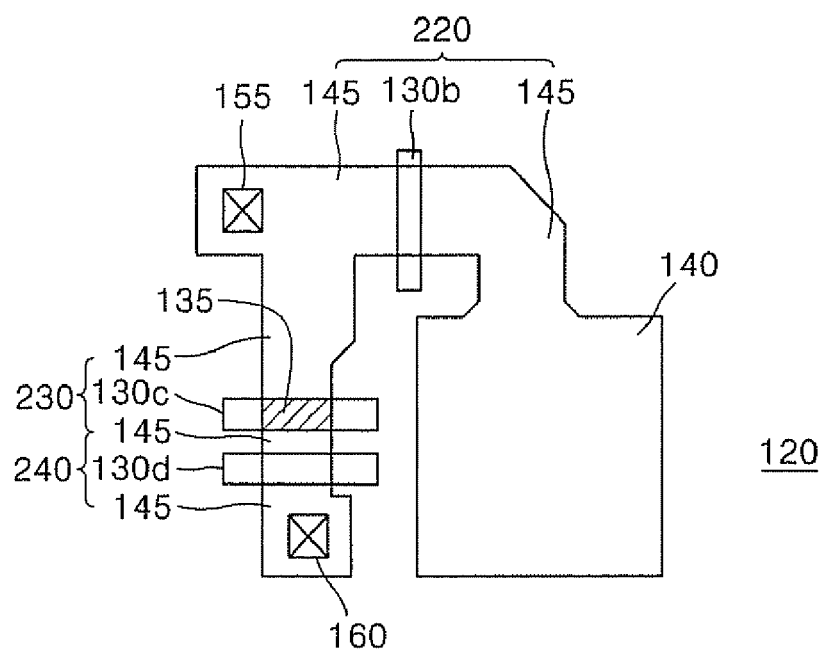
FIG. 14 is a plan view of the unit pixel of the CMOS image sensor of FIG. 13.

Similar to the unit pixel 100 of the CMOS image sensor of FIG. 1 having four transistors, the unit pixel 100a of the CMOS image sensor of FIG. 13 having three transistors is formed on an active region 115 including a first active region 111 to be formed with the photodiode 140 and a second active region 112 to be formed with the transistors as illustrated in FIG. 14. FIG. 14 is a plan view of the unit pixel 100a of the CMOS image sensor of FIG. 12. N-type and p-type impurities are implanted at the first active region 111 to form the photodiode 140. A reset gate 130b, a drive gate 130c, and a select gate 130d, which are spaced apart from one another by a predetermined interval, are arranged on the second active region 112 on one side of the photodiode 140. Here, a contoured channel region 135 is formed in the active region 112 where the drive gate 130c will be formed. Moreover, the region 135 may be formed in at least one channel region of the reset gate 130b, the drive gate 130c, and the select gate 130d, or may be formed on the entire surface of the active region 115 similarly to the previous embodiment. When manufacturing the channel region 135, all of the above-described embodiments may be applied. By implanting an impurity (e.g., an n-type impurity), to the second active region 112 on both sides of the gates 130b, 130c, and 130d of the previous embodiments, a junction region 145 is formed, thereby completing the unit pixel 100a.

Accordingly, as described above with respect to FIGS. 1-3, embodiments of the present invention include a CMOS image sensor formed in a semiconductor substrate having an active region 110 of first conductivity type therein extending adjacent a surface of the substrate. A unit cell of a CMOS image sensor includes a P-N junction photodiode 140 and a drive transistor 230 in the active region 110. The drive transistor 230 has a gate electrode 130c configured to receive charge generated in the P-N junction photodiode 140 during an image capture operation. The gate electrode 130c extends opposite a contoured channel region 135, which has an effective channel length greater than a length of the gate electrode 130c. This contoured channel region 135 is illustrated in FIG. 3 as being defined by a recess (e.g., trench) that is lined with a gate insulating layer. In FIGS. 6B and 11, the contoured channel region 137 includes a plurality of side-by-side recesses that result in an undulating peak-and-valley surface profile extending opposite the gate electrode 130c. In FIGS. 7B and 10, the contoured channel regions 136 are illustrated as vertical protrusions.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An integrated circuit device, comprising:
   a substrate having a semiconductor active region of first conductivity type therein extending adjacent a surface thereof; and
   a unit cell of a CMOS image sensor having a P-N junction photodiode and a drive transistor in the active region, said drive transistor having a gate electrode configured to receive charge generated in the P-N junction photodiode during an image capture operation, said gate electrode extending opposite a contoured channel region having an effective channel length greater than a length of said gate electrode, said contoured channel region extending along a sidewall and bottom of a recess in the active region into which said gate electrode extends.

2. The device of claim 1, wherein the contoured channel region extends across a portion of a surface of the active region having a plurality of peaks and valleys therein extending opposite said gate electrode.

3. The device of claim 1, further comprising a gate insulating layer extending between said gate electrode and the sidewall of the recess; and wherein said gate electrode extends into the recess.

4. The device of claim 1, wherein said gate electrode of the drive transistor is directly electrically coupled to a cathode terminal of the P-N junction photodiode.

5. The device of claim 4, further comprising a reset transistor having a source/drain region directly electrically coupled to the cathode terminal.

6. The device of claim 4, further comprising a reset transistor having a gate electrode extending opposite a portion of the active region having a contoured surface profile.

7. The device of claim 6, wherein the contoured surface profile has a plurality of peaks and valleys therein.

8. The device of claim 1, further comprising a reset transistor having a gate electrode extending opposite a portion of the active region having a contoured surface profile.

9. An integrated circuit device, comprising:
   a substrate having a semiconductor active region of first conductivity type therein extending adjacent a surface thereof; and
   a unit cell of a CMOS image sensor having a P-N junction photodiode and a drive transistor in the active region, said drive transistor having a gate electrode electrically connected to a cathode terminal of the P-N junction photodiode, said gate electrode extending opposite a contoured channel region having a plurality of undulations extending opposite said gate electrode, said contoured channel region extending along a sidewall and bottom of a recess in the active region into which said gate electrode extends.

10. The device of claim 9, wherein said drive transistor includes a gate insulating layer extending between said gate electrode and the contoured channel region.

11. The device of claim 9, wherein said unit cell further comprises a reset transistor having a source/drain region directly electrically coupled to the cathode terminal.

12. A method of forming a CMOS image sensor cell, comprising the steps of:
   forming a recess in a surface of a semiconductor active region of first conductivity type;
   lining the recess with a gate insulating layer;
   forming a gate electrode of a drive transistor on the lined recess; and
   forming a P-N junction photodiode in the active region;
   wherein said step of forming a recess comprises forming a plurality of recesses located side-by-side in the surface of the semiconductor active region so that the surface of the semiconductor active region has an undulating surface profile; and wherein said step of forming a gate electrode comprises forming a gate electrode of a drive transistor opposite the plurality of recesses.

13. A method of forming a CMOS image sensor cell, comprising the steps of:
   forming a recess in a surface of a semiconductor active region of first conductivity type;
   lining the recess with a gate insulating layer;
   forming a gate electrode of a drive transistor on the lined recess; and
   forming a P-N junction photodiode in the active region;

wherein said step of forming a recess comprises forming first and second pluralities of recesses located side-by-side in the surface of the semiconductor active region; and wherein said step of forming a gate electrode comprises forming a gate electrode of a drive transistor opposite the first plurality of recesses and forming a gate electrode of a reset transistor opposite the second plurality of recesses.

* * * * *